United States Patent
Sotta et al.

(10) Patent No.: US 12,328,975 B2
(45) Date of Patent: Jun. 10, 2025

(54) OPTOELECTRONIC SEMICONDUCTOR STRUCTURE COMPRISING A P-TYPE INJECTION LAYER BASED ON InGaN

(71) Applicant: Soitec, Bernin (FR)

(72) Inventors: David Sotta, Grenoble (FR); Mariia Rozhavskaia, Grenoble (FR); Benjamin Damilano, Nice (FR)

(73) Assignee: Soitec, Bernin (FR)

( * ) Notice: Subject to any disclaimer, the term of this patent is extended or adjusted under 35 U.S.C. 154(b) by 664 days.

(21) Appl. No.: 17/435,014

(22) PCT Filed: Feb. 25, 2020

(86) PCT No.: PCT/EP2020/054825
§ 371 (c)(1),
(2) Date: Aug. 30, 2021

(87) PCT Pub. No.: WO2020/182457
PCT Pub. Date: Sep. 17, 2020

(65) Prior Publication Data
US 2022/0140190 A1 May 5, 2022

(30) Foreign Application Priority Data

Mar. 11, 2019 (FR) ........................................ 1902447

(51) Int. Cl.
*H10H 20/825* (2025.01)
*H10H 20/812* (2025.01)

(52) U.S. Cl.
CPC ........ *H10H 20/825* (2025.01); *H10H 20/812* (2025.01)

(58) Field of Classification Search
CPC ......... H01L 33/12; H01L 33/06; H01L 33/32; H10H 20/825; H10H 20/812
See application file for complete search history.

(56) References Cited

U.S. PATENT DOCUMENTS

| 5,777,350 A * | 7/1998 | Nakamura ............. B82Y 20/00 257/97 |
| 2002/0167019 A1 | 11/2002 | Nakamura et al. |
| 2002/0195619 A1 | 12/2002 | Makimoto et al. |
| 2008/0111144 A1 | 5/2008 | Fichtenbaum et al. |

(Continued)

FOREIGN PATENT DOCUMENTS

| CN | 102157656 A * | 8/2011 | ............. H01L 33/32 |
| CN | 103022211 A | 4/2013 | |

(Continued)

OTHER PUBLICATIONS

International Search Report for International Application No. PCT/EP2020/054825 dated May 7, 2020, 4 pages.

(Continued)

*Primary Examiner* — Zandra V Smith
*Assistant Examiner* — John M Parker
(74) *Attorney, Agent, or Firm* — TraskBritt

(57) ABSTRACT

An optoelectronic semiconductor structure comprises an InGaN-based active layer disposed between an n-type injection layer and a p-type injection layer, the p-type injection layer comprising a first InGaN layer having a thickness between 50 and 350 nm and, disposed on the first layer, a second layer having a GaN surface portion.

5 Claims, 1 Drawing Sheet

(56) References Cited

U.S. PATENT DOCUMENTS

| | | | |
|---|---|---|---|
| 2013/0017639 A1 | 1/2013 | Boyama et al. | |
| 2013/0161586 A1* | 6/2013 | Okuno | H01L 33/12 438/47 |
| 2013/0228806 A1* | 9/2013 | Wang | B82Y 20/00 257/E33.026 |
| 2014/0110743 A1* | 4/2014 | Kang | H01L 21/28575 257/99 |
| 2015/0144871 A1* | 5/2015 | Miller | H01S 5/0424 257/13 |

FOREIGN PATENT DOCUMENTS

| | | |
|---|---|---|
| CN | 104009136 A | 8/2014 |
| EP | 0215852 A1 | 4/1987 |
| EP | 0215856 B2 | 12/1993 |
| EP | 0716457 B1 | 9/2008 |
| EP | 2843714 B1 | 4/2012 |
| TW | 344147 B | 11/1998 |
| TW | 201828449 A | 8/2018 |
| WO | 2013/009552 | 1/2013 |
| WO | 2013/189949 A1 | 12/2013 |

OTHER PUBLICATIONS

International Written Opinion for International Application No. PCT/EP2020/054825 dated May 7, 2020, 6 pages.
Taiwanese Office Action for Application 109105908 dated Jul. 4, 2023, 11 pages.
Farrell et al., Bisphosphonate Conjugation for Bone Specific Drug Targeting, Bone Reports, vol. 9, (2018), pp. 47-60.
Manolagas et al., Birth and Death of Bone Cells: Basic Regulatory Mechanisms and Implications for the Pathogenesis and Treatment of Osteoporosis, Endocrine Reviews, (2000), vol. 21, No. 2, pp. 115-137.
Roodman et al., Advances in Bone Biology: The Osteoclast, Endocrine Reviews, (1996), vol. 17, No. 4, pp. 308-332.
Taiwanese Office Action from Taiwanese Application No. 11221261370, dated Dec. 18, 2023, 5 pages.
Chinese First Office Action for Application No. 202080008522.X dated Jul. 8, 2024, 8 pages.

* cited by examiner

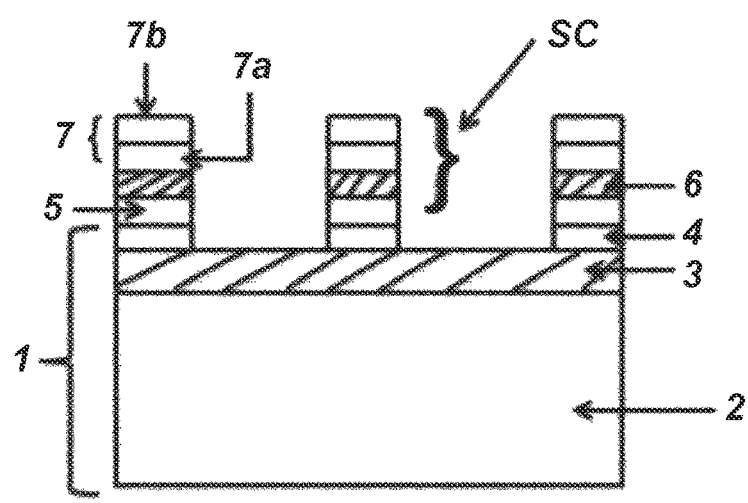

OPTOELECTRONIC SEMICONDUCTOR STRUCTURE COMPRISING A P-TYPE INJECTION LAYER BASED ON InGaN

CROSS-REFERENCE TO RELATED APPLICATIONS

This application is a national phase entry under 35 U.S.C. § 371 of International Patent Application PCT/EP2020/054825, filed Feb. 25, 2020, designating the United States of America and published as International Patent Publication WO 2020/182457 A1 on Sep. 17, 2020, which claims the benefit under Article 8 of the Patent Cooperation Treaty to French Patent Application Serial No. 1902447, filed Mar. 11, 2019.

TECHNICAL FIELD

The present disclosure concerns an optoelectronic semiconductor structure, such as a light-emitting diode (LED), a solar cell or a laser diode. It concerns, in particular, an optoelectronic semiconductor structure with a P-type injection layer made of InGaN.

BACKGROUND

An optoelectronic semiconductor structure is generally formed by a stack of crystalline semiconductor layers, including an active layer between an n-type injection layer and a p-type injection layer. In the case of an LED structure, the active layer can consist of an alternation of barrier layers and quantum well layers. To allow a homogeneous and dense flow of the current through the structure, the injection layers must be sufficiently thick; for example, well above 200 nm.

In InGaN-based structures, the indium content of a quantum well layer can be in the order of 10% to form a diode emitting in blue, above about 20% when the diode emits in green, and above about 40% for a diode emitting in red. Barrier layers have a lower indium content than quantum well layers.

The higher the indium content, the more important is the natural lattice parameter (i.e., that of a layer that would be perfectly relaxed) of the quantum well layer. In other words, the higher the indium content, the more the quantum well layer is compressively strained when formed on a growth medium with a specified lattice parameter.

Excessive strain in the stack forming an optoelectronic structure can lead to a defective structure. This strain can notably be at the origin of cracks or pyramidal defects (referred to as "V-pits" in the literature in this field) forming on the surface of the GaN or InGaN films that make up the structure. These defects deteriorate the functional performance of the optoelectronic structure.

To be less sensitive to this problem, documents EP215852 or EP215856 are known to describe manufacturing processes aimed at collectively forming semiconductor structures on superficial islands of InGaN of a growth support. For example, these islands may have an indium concentration of between 5% and 7% or more, and are at least partially relaxed.

The aim is to grow the n-type injection layer in InGaN on this growth support so that it matches as closely as possible the lattice parameter of the material forming the surface of the growth islands. This reduces stresses in the active layer of the semiconductor structure that is formed on the substrate, and promotes the incorporation of indium into the active layer and, more generally, improves the efficiency of the optoelectronic device.

However, the formation of a p-type injection layer in such an optoelectronic semiconductor structure is problematic, especially when targeting long wavelengths (in green or red) with high indium content in quantum well layers.

When this p-type injection layer is made of GaN, the difference in lattice parameters with the active InGaN layer on which it rests imposes a high stress on the injection layer and can lead to cracks.

When this p-type injection layer is made of InGaN, it may have pyramidal through defects. The critical thickness of an InGaN film in which this type of defect develops decreases very rapidly with indium concentration. It is about 150 nm for concentrations less than or equal to 10% and barely 50 nm for 15% indium.

When, during the manufacture of a semiconductor structure, a wet treatment with a liquid agent is carried out (e.g., when such structures are treated with KOH to deoxidize the surfaces of the p-type injection layer to prepare for the formation of metallic electrical contacts), cracks or pyramidal defects in the injection layer form diffusion channels within the structure for the liquid treatment agents. This leads to deterioration of the structure, and, in particular, the crystalline quality of the layers that compose it.

BRIEF SUMMARY

The present disclosure aims to solve at least part of this problem. In particular, it aims to form an optoelectronic semiconductor structure comprising an InGaN p-type injection layer whose crystalline properties can be preserved, even when it is subjected to a wet treatment using a liquid agent that may damage it.

To reach this goal, the object of this disclosure proposes an optoelectronic semiconductor structure comprising an InGaN-based active layer disposed between an n-type injection layer and a p-type injection layer, the p-type injection layer comprising a first InGaN layer presenting a thickness between 50 and 350 nm and, disposed on the first layer, a second layer having a GaN surface portion.

According to other advantageous and non-restrictive characteristics of the present disclosure, taken either separately or in any technically feasible combination:
- the GaN surface portion has a thickness of less than 50 nm;
- the second layer is made of GaN;
- the second layer consists of an InGaN layer whose indium composition decreases towards the surface from an initial value to zero;
- the p-type injection layer comprises, on and in contact with the surface portion of GaN, a complementary layer of InGaN; and
- the n-type injection comprises a super lattice.

BRIEF DESCRIPTION OF THE DRAWINGS

Other characteristics and advantages of the present disclosure will become apparent from the detailed description of embodiments of the disclosure that follows with reference to FIG. 1, which represents an optoelectronic semiconductor structure according to the present disclosure, placed on a growth medium.

DETAILED DESCRIPTION

FIG. 1 shows a plurality of optoelectronic semiconductor structures SC, in this case LEDs, arranged on a growth support 1.

The structure SC comprises an n-type injection layer 5, a p-type injection layer 7, and arranged between these two layers, an LED active layer 6.

Growth support 1 is an "islands" support, a detailed description of which can be found in the documents cited in the introductory part of the present disclosure. It therefore comprises a base substrate 2, for example, sapphire, an intermediate layer 3 formed of a material or a plurality of dielectric materials, such as silicon dioxide or silicon nitride, and a plurality of at least partially relaxed growth islands 4.

In general, growth islands 4 are made of a material with the general formula AlInGaN and have a lattice parameter corresponding to the natural lattice parameter of an InGaN layer, with an indium content of between 5% and 40%.

In the example of FIG. 1, growth islands 4 consist of InGaN, with an indium content of 15%, and are 90% relaxed.

On growth islands 4 a plurality of semiconductor structures SC were formed by conventional epitaxy techniques. These can be a vapor phase metal organic deposition (e.g., MOCVD) technique or a molecular beam epitaxy (MBE) technique.

A structure SC here is formed by an n-type injection layer 5 of InGaN, for example, doped with silicon in a concentration of the order of $10^{18}$ to $10^{19}$ cm$^{-3}$. Its indium concentration is approximately equal to that of the material constituting growth islands 4, around 13.5%, in order to match their lattice parameters or keep the injection layer 5 under slight tensile strain. The thickness of this layer ranges typically from 100 nm to 400 nm or more.

In an alternative to the example shown in FIG. 1, the n-type injection layer 5 can be made as or comprises a super lattice. This may involve forming a plurality of very thin elementary layers of AlInGaN, with a thickness of less than a few tens of nanometers, for example, 30 nm, and of different natures. Thus, injection layer 5 may be formed by repeating a periodic structure comprising a first elementary layer of InGaN and a second elementary layer of GaN, AlN, or AlGaN. The elementary layers all have a thickness less than their critical relaxation thickness.

The proportions of aluminum, indium and gallium and the thicknesses of each layer making up the super lattice shall be chosen so that the layer of corresponding homogeneous composition has a natural lattice parameter substantially equivalent to the lattice parameter of growth islands 4. As in the case of a homogeneous n-type injection layer 5, the tensile or compressive stresses that accumulate in the semiconductor structure during its growth are thus limited.

Returning to the description of FIG. 1, the optoelectronic semiconductor structure SC also includes, on the n-type injection layer 5, an active layer 6. This layer is formed by a plurality of alternating InGaN barrier layers—quantum well layers. The barrier layers have a concentration of indium similar to that of the n-type injection layer 5, in this case around 13.5%. InGaN quantum well layers have an indium concentration chosen according to the desired emission wavelength. In the example shown, this concentration is 25%.

More generally, the active layer is InGaN based. The quantum well layers may be made of InGaN presenting a first indium concentration, and the barrier layers may be made of InGaN presenting a second indium concentration, lower than the first concentration. The barrier layer may also be made of GaN or AlGaN, but the present disclosure is preferably directed to active layer where both the quantum well layers and the barrier layers are made of InGaN. Also, thin intermediate layers, for instance, made of AlGaN, may be inserted between the barrier and quantum well layers.

On active layer 6, the SC semiconductor structure has a p-type injection layer 7.

This p-type injection layer 7 is composed of a first layer 7a made up of p-doped InGaN, for example, incorporating a concentration of Mg of about $10^{18}$ cm$^{-3}$. This first layer 7a typically has a thickness of between 50 and 350 nm. The lattice parameter of this layer is aimed to match that of the stack on which it is formed. In a very general way, the indium concentration of this first layer 7a corresponds to that of the n-type injection layer 5, here on the order of 13.5%. As mentioned in the introduction, this p-type injection layer 7 may have pyramidal defects, at least partially passing through the injection layer 7.

To limit the adverse effects of these defects, it is planned to form a second overlapping layer 7b over the first layer 7a.

This second layer 7b includes at least one GaN superficial portion, in order to avoid the appearance of pyramidal surface defects that develop in the InGaN, which may form through channels for a liquid treatment agent.

According to a first approach, the second layer 7b is formed by a p-type GaN layer. To avoid any cracking of this layer under the effect of its tensile stress, it has a very thin thickness, for example, less than 50 nm or 30 nm or even 10 nm. It can be doped with Mg in a concentration between $10^{19}$ and $10^{22}$ cm$^{-3}$.

According to a second approach, the second layer 7b is formed by a p-doped layer whose composition is of the general formula InGaN, and which has an indium composition generally decreasing from an initial value, on the side of the first layer 7a, to a value of zero on its opposite side. In this way, a second layer 7b is formed with a GaN surface portion. And the same overlapping effect as described in the first approach is obtained. In this second approach also, the second layer 7b is doped, for example, with Mg, in a concentration between $10^{19}$ and $10^{22}$ cm$^{-3}$. The layer has a thickness below 100 nm to avoid cracks.

The GaN surface portion of this second layer 7b must be relatively thin, a few tens of nm, for instance, 50 nm, to avoid the appearance of cracks.

Whichever approach is used to form the second layer 7b, it is possible to form a complementary layer 7c of InGaN, whose indium composition can be freely chosen, preferably similar to that of the first layer 7a. This complementary layer has a thickness up to 100 nm. Complementary layer 7c compensates for the tension that develops in the GaN surface portion of the second layer 7b. It may possibly have some through defects, it being understood that the SC structure as a whole is protected from any liquid processing agent by the second layer 7b.

An SC optoelectronic semiconductor structure conforming to this description comprises an InGaN p-doped injection layer with a protective layer. This protective layer does not have any structural defects such as cracks or pyramids. Therefore, after the formation of this structure, completely conventional treatments can be applied, for example, based on liquid agents that do not need to be replaced to take into account the existence of through defects.

Of course, the invention is not limited to the described embodiments and variations may be made without departing from the scope of the invention as defined by the claims.

In particular, the optoelectronic semiconductor structure SC may comprise additional layers beyond the described active layer 6, n-type injection layer 5 and a p-type injection layer 7. For instance, the optoelectronic semiconductor structure may comprise an electron blocking layer disposed between the active layer and the p-type injection layer, as this is very well known in the art. Such electron blocking layers may be formed of a thin layer (i.e., typically 20 nm) with an indium concentration lower than the indium concentration in the first InGaN layer 7a.

Although it has been indicated that the growth substrate is an islands substrate, it could be a substrate of any other nature that allows the growth of an InGaN-based optoelectronic semiconductor structure.

The invention claimed is:

1. An optoelectronic semiconductor structure comprising an InGaN-based active layer disposed between an n-type injection layer and a p-type injection layer, the p-type injection layer comprising a first InGaN layer having a thickness between 50 and 350 nm and, disposed on the first InGaN layer, a second layer having a GaN surface portion, wherein the second layer comprises an InGaN layer having an indium composition decreasing in a direction extending toward the GaN surface portion from an initial value to zero.

2. The optoelectronic semiconductor structure of claim 1, wherein the GaN surface portion has a thickness of less than 50nm.

3. The optoelectronic semiconductor structure of claim 1, wherein the p-type injection layer further comprises, on and in contact with the GaN surface portion, a complementary layer of InGaN.

4. The optoelectronic semiconductor structure of claim 3, wherein the n-type injection layer comprises a super lattice.

5. The optoelectronic semiconductor structure of claim 1, wherein the n-type injection layer comprises a super lattice.

* * * * *